(12) United States Patent
Swami (10) Patent No.: US 6,961,741 B2
(45) Date of Patent: Nov. 1, 2005

(54) LOOK-UP TABLE APPARATUS TO PERFORM TWO-BIT ARITHMETIC OPERATION INCLUDING CARRY GENERATION

(75) Inventor: Parvesh Swami, New Delhi (IN)

(73) Assignee: STMicroelectronics Ltd., Uttar Pradesh (IN)

( * ) Notice: Subject to any disclaimer, the term of this patent is extended or adjusted under 35 U.S.C. 154(b) by 623 days.

(21) Appl. No.: 10/076,116

(22) Filed: Feb. 14, 2002

(65) Prior Publication Data

US 2002/0116426 A1    Aug. 22, 2002

(30) Foreign Application Priority Data

Feb. 15, 2001    (IN)    ............ 151/DEL/2001

(51) Int. Cl.[7] .............................................. G06F 7/38
(52) U.S. Cl. ..................................................... 708/235
(58) Field of Search ..................... 708/235; 326/37–41

(56) References Cited

U.S. PATENT DOCUMENTS

| | | | |
|---|---|---|---|
| 5,274,581 A | | 12/1993 | Cliff et al. .................. 364/784 |
| 5,481,486 A | | 1/1996 | Cliff et al. .................. 364/716 |
| 5,594,367 A | * | 1/1997 | Trimberger et al. .......... 326/41 |
| 5,724,276 A | * | 3/1998 | Rose et al. ................. 708/235 |
| 5,761,099 A | * | 6/1998 | Pedersen .................... 708/230 |
| 5,926,036 A | * | 7/1999 | Cliff et al. .................. 326/40 |
| 6,034,544 A | * | 3/2000 | Agrawal et al. ............. 326/39 |
| 6,359,468 B1 | * | 3/2002 | Park et al. .................. 326/39 |
| 6,417,693 B1 | * | 7/2002 | Skahill et al. ............... 326/41 |
| 6,427,156 B1 | * | 7/2002 | Chapman et al. ........... 708/235 |
| 6,633,181 B1 | * | 10/2003 | Rupp .......................... 326/40 |

* cited by examiner

Primary Examiner—Tan V. Mai
(74) Attorney, Agent, or Firm—Lisa K. Jorgenson; Allen, Dyer, Doppelt, Milbrath & Gilchrist, P.A.

(57) ABSTRACT

A look-up table apparatus is provided for performing two-bit arithmetic operation including carry generation. The look-up table is modified to perform two concurrent combinatorial functions, or one function for an increased number of inputs. The look-up table can implement two full adders or subtractors, or two-bit counters, for example. One portion of the modified look-up table provides two bits of a sum output, and another portion of the modified table provides a fast carry out signal for application to a next stage of an adder/subtractor/counter.

28 Claims, 5 Drawing Sheets

LOOK-UP TABLE APPARATUS TO PERFORM TWO-BIT ARITHMETIC OPERATION INCLUDING CARRY GENERATION

FIELD OF THE INVENTION

The present invention relates to programmable logic devices, and, more particularly, to an improved look-up table apparatus to perform two-bit arithmetic operations including carry generation.

BACKGROUND OF THE INVENTION

Certain programmable logic devices use programmable look-up tables to perform logic functions. The outputs of such look-up tables can be combined together using similar look-up tables to provide more complex functions.

Look-up tables which are used for performing elementary logic functions can also be used for performing some "special" functions like addition, subtraction, counting, etc. However, to perform such functions, the size of a look-up table will typically need to be quite large. To perform one-bit full addition, two look-up tables are used, one for computing the sum and one for generating the carry. For example, four input look-up tables may be an apropriate size for general use, but they may be larger than necessary for one-bit full adders or counters. Thus, it is a waste of resources to use such a look-up table for addition or counting.

Nonetheless, counters and adders are commonly used in digital logic. If addition or counting of larger numbers of bits is required, then more look-up tables are also required (two for each bit of operation). This results in reduced speed of operation and increased waste of look-up table resources.

U.S. Pat. Nos. 5,481,486 and 5,274,581, both to to Cliff et al., describe look-up tables for use in programmable logic devices which are modified to be used as adders, substractors, and various types of counters. The invention in these patents divide four input look-up tables (LUTs) into two, three-input LUTs for implementing the arthimetic functions. Yet, these tables implement only one-bit full addition because they are using the first three-input LUT for sum generation bits and the other three-input LUTs to generate the bits to control the carry logic. Thus, a four-input LUT with a single output and a carry logic is provided.

SUMMARY OF THE INVENTION

An object of the invention is to provide improved ways to implement two-bit adders or counters using look-up tables in programmable logic devices.

Another object of the invention is to use look-up table resources efficiently for implementing the functions of two inputs or more than two inputs.

Yet another object of the invention is to provide programmable logic devices including look-up tables in which two-bit full addition or counting can be performed without excessive waste of look-up table resources.

A further object of the invention is to provide ways of improving speed performance of such adders and counters in programmable logic devices implemented using look-up tables.

Still another object of the invention is to implement a two-bit output with carry out logic using a single four-input LUT.

To achieve the above objects, the present invention provides a programmable look-up table (LUT) apparatus which may include a plurality of programmable data storage cells, each of which produces a cell output signal indicative of the data stored in that cell. Further, means or circuitry may also be provided for normally selecting from all of the cell output signals any one of the cell output signals as a normal output signal on a normal output lead of the look-up table apparatus. The means for normally selecting may be responsive to a plurality of first input signals such that each of said first input signals normally controls a respective one of a plurality of successive selection means or circuitry which collectively form the means for selecting.

A first one of the selection means may select one of two mutually exclusive and collectively exhaustive subsets of the cell output signals. Each succeeding selection means may select one of two mutually exclusive and collectively exhaustive subsets of the cell output signals selected by the preceding selection means until a final one of the selection means produces the normal output signal on the normal output lead.

More particularly, to enable the look-up table apparatus to perform two-bit arithmetic operation, the LUT apparatus may be divided into two equal halves, excluding the final selection means, in which each half includes half the remaining selection means, half the number of the data storage cells, and half the input signals. Furthermore, first means or circuitry may be included for choosing a selection input for the final selection means in each half to be either a first input signal from the second half during normal mode, or the carry output from the previous bit operation during arithmetic mode, while the final selection means at the output of the complete LUT apparatus receives a second input signal from the second half. Also, a second means or circuitry may be included for connecting the output from the final stage of the first half as the least significant bit output of the two-bit arithmetic operation, and the output of the final stage of the second half may be used as the most significant output bit of the two-bit arithmetic operation during arithmetic mode. This may be done while allowing normal selection operation using one of the input signals from the other half during normal mode.

The above programmable look-up table (LUT) apparatus may further include means or circuitry for selectively applying either one input signal of the second half or one input signal of the first half as the first input signal to the second half. Further, additional logic means or circuitry may be connected to each half for generating a carry out for the corresponding bit operation, while simultaneously generating the sum output, using the same memory elements of the LUT. The logic means may include an exclusive-OR (XOR) device for receiving the outputs from the penultimate selection means of one of the halves as a selection signal for selecting either the carry-in signal or the second input signal to the half to generate the carry out signal.

In addition, the LUT apparatus of the present invention may further implement a counting mode of operation wherein storage elements at the output of each half are used to store the result of the previous arithmetic operation for use as an input to the half for counting when the counting mode is selected. The first means in each half may be a multiplexing means, and the select input to the multiplexing means in each half may be from a memory. The second means may be an AND gate. The first means for each half may either be the first input signal from the other half during normal mode, or the carry output from the lower significant bit operation during arithmetic mode.

Also, the final selection means at the output of the complete LUT apparatus may be the XOR of the last selection signal from each half. This enables the use of the LUT as either a single LUT of n inputs or two independent LUTs of n−1 inputs, each in normal mode, while retaining all the functionality of the arithmetic mode of operation. An electronic and counting unit including an LUT as briefly described above is also provided in accordance with the present invention.

BRIEF DESCRIPTION OF THE DRAWINGS

The invention will now be described further with reference to the accompanying drawings, in which.

DETAILED DESCRIPTION OF THE PREFERRED EMBODIMENTS

Figure 1:
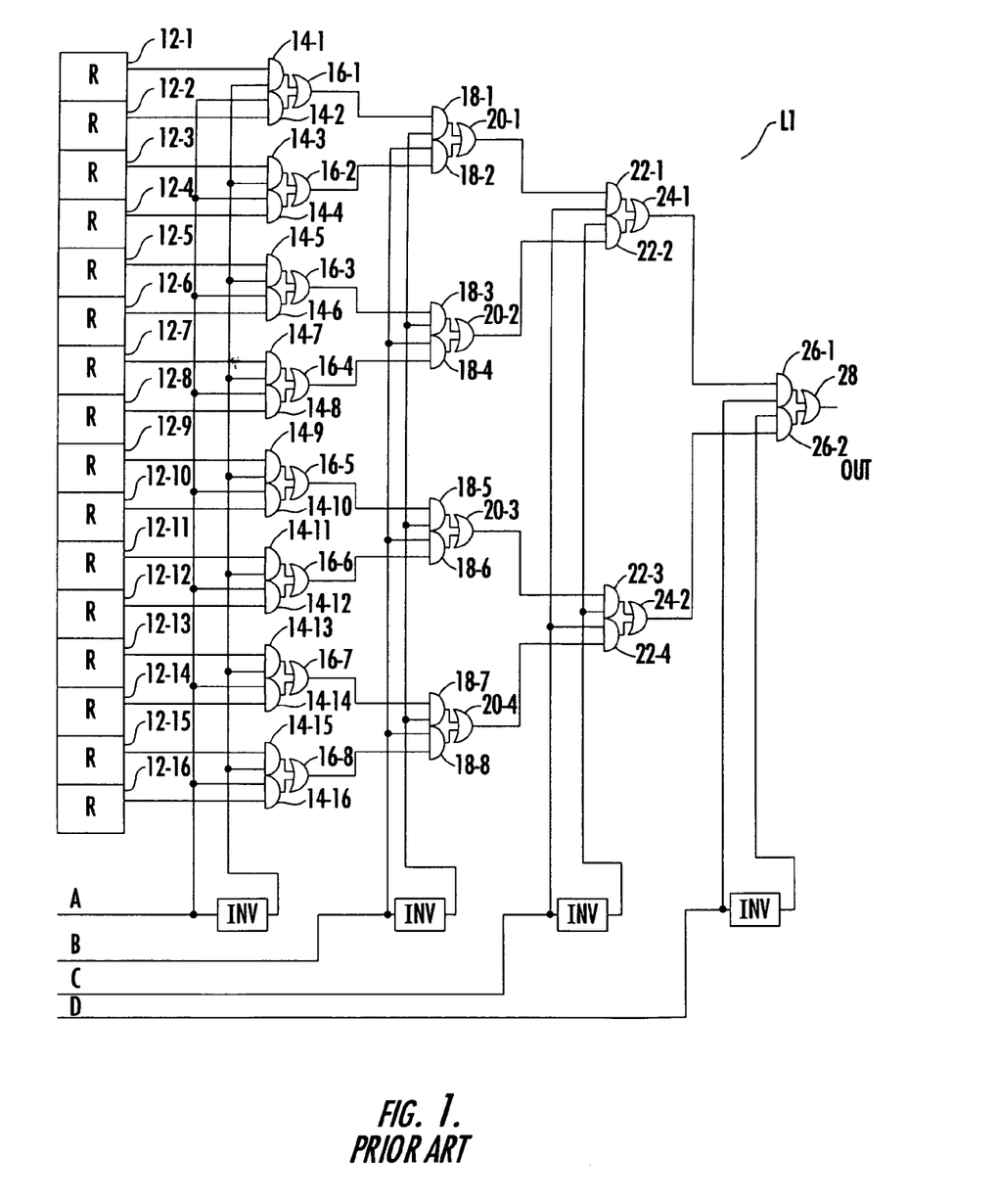
FIG. 1 is a schematic block diagram of prior art look-up table apparatus.

Turning now to FIG. 1, a conventional four input look-up table L1 according to the prior art is illustratively shown. The look-up table L1 has 16 memory elements 12-1 through 12-16, each of which stores one-bit of information. Each memory element (ME) may be a flip-flop, a random access memory (DRAM or SRAM), EPROM, EEPROM, a cell of a first-in first-out (FIFO) device, a ferroelectric memory cell, a fuse, an antifuse, etc. The contents of these memory cells can be fixed, or they can be programmed once or repeatedly. The four inputs A–D select the output of one of the memory elements to pass to the output of the look-up table L1.

The output of each memory element is applied to one of the inputs of respective AND gates 14-1 through 14-16. Input A is applied to inputs of AND gates 14-2, 14-4, 14-6, 14-8, 14-10, 14-12 and 14-14, and, after inversion, is applied to inputs of respective AND gates 14-1, 14-3, 14-5, 14-7, 14-9, 14-11, 14-13, and 14-15. Accordingly, half of the AND gates 14 are enabled by input A, and the other half is disabled. The OR gates 16 pass the outputs of enabled AND gates 14 to the next level of AND gates 18.

Input B is applied to one of the inputs of AND gates 18-2, 18-4, 18-6 and 18-8, and, an inverted input B is applied to one of the inputs of AND gates 18-1, 18-3, 18-5 and 18-7. Thus, input B enables half of the AND gates 18 and disables the second half of those AND gates. Input B therefore selects four of the eight memory cells' 12 outputs selected by input A. The OR gates 20 pass the outputs of the enabled AND gates to the next level of AND gates 22.

The input C is applied to one of the inputs of the AND gates 22-2 and 22-4, and, an inverted input C is applied to one of the inputs of AND gates 22-1 and 22-3. Input C thus enables one half of AND gates 22 and disables the second half of the AND gates. Thus, input C selects two of the four memory cells' 12 outputs selected by input B. The OR gates 24 pass the outputs of the enabled AND gates to next level of AND gates 26.

Input D is applied to one of the inputs of the AND gate 26-2, and an inverted input D is applied to one of the inputs of AND gate 26-1. Input D enables one half of the AND gates 26 and disables the second half of those AND gates. Thus, input D selects one of the two memory cells' 12 outputs selected by input C. The OR gate 28 passes the output of enabled AND gate as a final output of look-up table L1.

Figure 4:
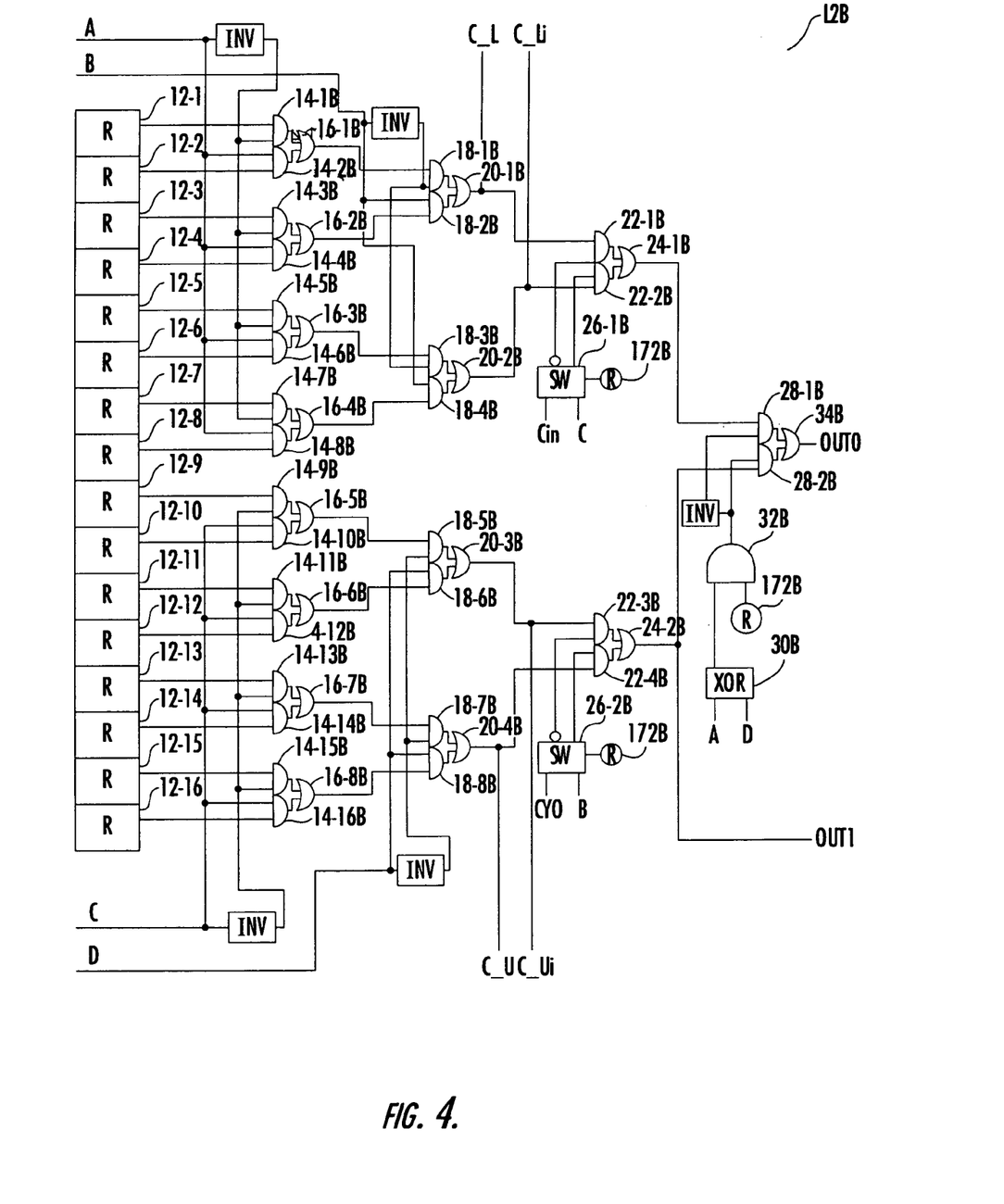
FIG. 4 is a schematic block diagram of an alternate embodiment of the look-up table apparatus of FIG. 2 using an XOR gate.

Two look-up tables L1 are required for a full adder. As used herein, a "full adder" refers to both an adder and a subtractor. That is, one is for sum generation and one is for carry generation. With some modifications in the prior art look-up table L1, one look-up table can advantageously be used for implementing two full adders. Accordingly, a modification of the look-up table L1 in accordance with the present invention is shown in FIGS. 2 and 4 which can provide two sum outputs on leads OUT0 and OUT1, with OUT0 as LSB and OUT1 as MSB, and outputs required to generate carry on leads C_L and C_Li corresponding to the LSB, and C_U and C_Ui corresponding to the MSB.

Figure 2:
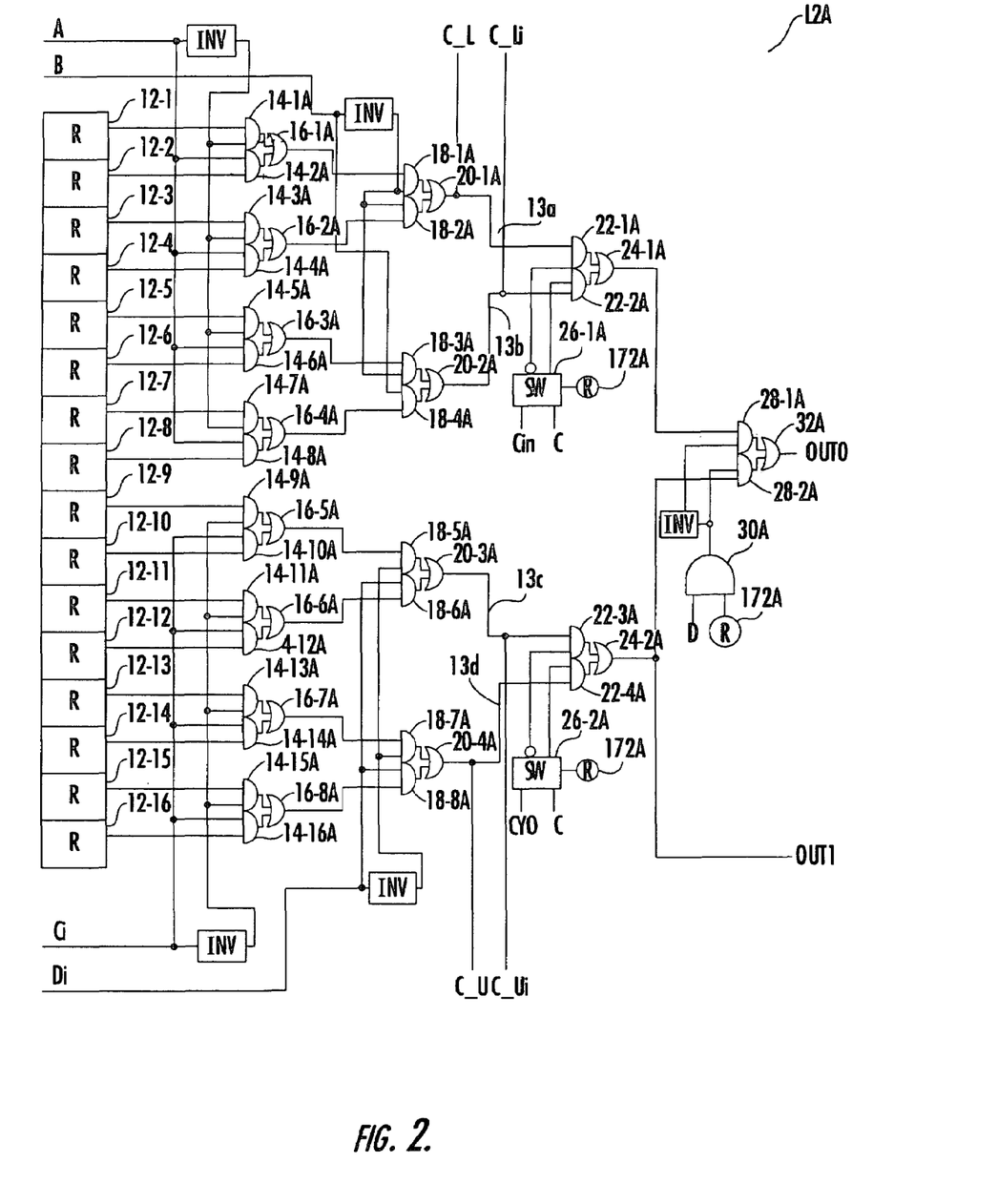
FIG. 2 is a schematic block diagram of a modified look-up table apparatus according to the invention.

The LUT apparatus of FIG. 1 is modified as shown in FIG. 2 to provide two-bit arthimetic operation including carry generation by splitting the input D into inputs D and Di, and the input C is split into inputs C and Ci. The output of sixteen memory cells 12 are connected to one of the inputs of respective AND gates 14-1A through 14-16A. The input A is applied to one of the inputs of AND gates 14-2A, 14-4A, 14-6A, and 14-8A, and the inverted input A is applied to one of the inputs of the AND gates 14-iA, 14-3A, 14-5A, and 14-7A. The input Ci is applied to one of the inputs of the AND gates 14-10A, 14-12A, 14-14A, and 14-16A, and the inverted input Ci is applied to one of the inputs of the AND gates 14-9A, 14-11A, 14-13A, and 14-15A. Thus, inputs A and Ci enable half of the AND gates 14A and disable the other half. Further, the OR gates 16A pass the output of enabled AND gates 14A to the next level of AND gates 18A.

The input B is applied to one of the inputs of the AND gates 18-2A and 18-4A, and the inverted input B is applied to one of the inputs of the AND gates 18-1A and 18-3A. The input Di is applied to one of the inputs of the AND gates 18-6A, and, the inverted input Di is applied to one of the inputs of the AND gates 18-5A and 18-7A. The inputs B and Di enable half of the AND gates 18A and disable the other half of the AND gates. Thus, inputs B and Di select four of the eight memory cells' 12 outputs selected by inputs A and Ci. The OR gates 20A pass the outputs of the enabled AND gates 18A to the next level of AND gates 22A and to the outputs C_L, C_Li, C_U, C_Ui of the look-up table L2A.

The output of the switch 26-1A, which selects one of the inputs Cin or C and is controlled by output of ME 172A, is applied to one of inputs of the AND gate 22-2A, and an inverted output thereof is applied to one of the inputs of the AND gate 22-1A. The output of the switch 26-2A, which selects one of the inputs CY0 or C and is controlled by output of ME 172A, is applied to one of inputs of the AND gate 22-4A, and an inverted output thereof is applied to one of the inputs of the AND gate 22-3A. Two of the three inputs (either Cin and CY0 or C) enable half of the AND gates 22A and disable the other half of the AND gates. Thus, two of the four memory cells' 12A outputs selected by inputs B and Di are selected by the above noted two of four inputs. The OR gates 24A pass the outputs of the enabled AND gates 22A to the next level of AND gates 28A. The output of the OR gate 24A is passed to the next level of AND gates 28A, and the output of the OR gate 24-2A is also passed to the output OUT1 of the look-up table L2A.

The output of AND gate 30A, whose inputs are input D and the output of ME 172A, is applied to one of the inputs of the AND gate 28-2A, and an inverter output thereof is applied to one of the inputs of the AND gate 28-1A. The aforementioned output enables half of the AND gates 28A and disables the other half of the AND gates. Thus, one of the two memory cells' 12 outputs passed by the previous level OR gates 24A is selected. The OR gate 32A passes the outputs of the enabled AND gates 28A to the final output OUT0 of look-up table L2A.

Figure 3:
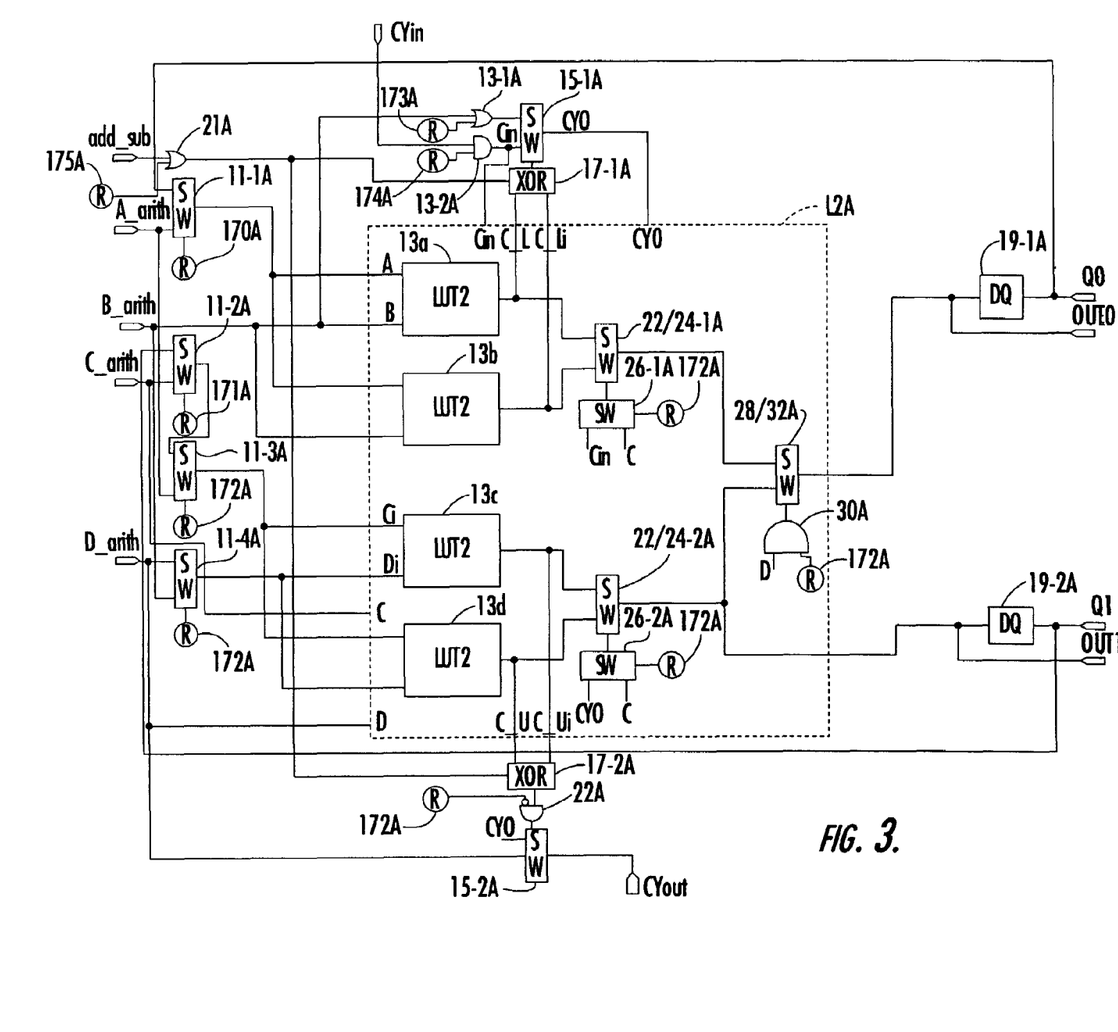
FIG. 3 is a schematic block diagram of a complete arithmetic and counting unit using the look-up table of FIG. 2.

Referring now to FIG. 3, an example of how the present invention provides a two-bit output with carry out logic using a single four input LUT is illustratively shown. More particulary, this example shows how the modified look-up table L2A of FIG. 2 can be used with other circuitry in accordance with the present invention to provide a highly flexible logic block for use in programmable logic arrays. The programmable logic block (PLB) as shown in FIG. 3 has four regular data inputs A_arith–D_arith (these inputs are configurably connected to the inputs A–D), a carry in input CYin (which is the carry out output of another PLB), and an add_sub input which can dynamically set the addition or subtraction mode during binary arithmetic operation, or an up or down counting mode during binary counter operation.

The PLB of FIG. 3 has five outputs, i.e., four regular data outputs from output drivers and a carry out output. The carry out output connects to the carry in input of another PLB, typically an adjacent PLB, and is used for carrying out addition, subtraction, addition and subtraction, or counting (up, down, up and down, and skip). Skip counting here means that counting states can be skipped by giving the value by which skipping is to occur (both up and down).

When the PLB is used to perform normal logic operation rather than addition, subtraction or counting, switch 11-1A, which is controlled by the output of ME 170A, connects the input A_arith of the PLB to the input A of the look-up table L2A. The switches 11-2A and 11-3A, which are controlled by the output of ME 171A and 172A, respectively, connect the input A_arith of the PLB to the input Ci. Further, the switch 26-1A of the look-up table L2A passes the input C_arith of the PLB to its output. The switch 26-2A of the look-up table L2A also passes the input C-arith of the PLB to its output, and the AND gate 30A of the look-up table L2A passes the input D_arith of the PLB to its output.

The switch 11-4A, which is controlled by the output of ME 172A, connects the input B_arith of the PLB to the input Di. The outputs OUT0 and OUT1 of the look-up table L2A are applied to the outputs OUT0 and OUT1 of the PLB, respectively. These outputs OUT0 and OUT1 are also connected to the inputs of flip-flops 19-1A and 19-2A, respectively, which provide outputs Q0 and Q1 respectively.

In a normal mode of operation of the PLB, two functions of two inputs (these two inputs are A_arith and B_arith, and C_arith and D_arith) can also be implemented using same look-up table L2A. In this mode all the connections remain the same as in the normal mode (as discussed above), except that the switch 26-1A of the look-up table L2A passes the input Cin of the look-up table L2A to its output, and the output of the AND gate 30A of the look-up table L2A is tied to logic low.

In the arithmetic mode of operation, one PLB can perform a maximum of two places of binary addition or subtraction, or addition and subtraction. In this mode all the connections are the same as that in the mode described above. The outputs C_L, C_Li (which in this mode is a inversion of C_L) and C_U, C_Ui (i.e., the inversion of C_U) of the look-up table L2A are connected to inputs of switches 17-1A and 17-2A, respectively, which are controlled by the output of the OR gate 21A.

The OR gate 21A has an add_sub input of the PLB and the output of ME 175A connected to its inputs. The switches 17A implement XOR functionality in this mode, where the second input thereto is the complement first input. The output of the switch 17-1A is connected to a control input of the switch 15-1A, whose inputs are the outputs of the gates 13-1A and 13-2A, which is used to generate the carry out signal CY0. The output of the gate 13-1A is passed to the output of the switch 15-1A when its control input is logic low. The gate 13-2A has the input Cyin and the output of ME 174A as its inputs. The gate 13-1A has as its inputs the input B_arith and this output of ME 173A.

In this mode, the gate 13-2A can be configured to pass either a carry from the previous stage or a logic low signal, and the gate 13-1A is configured to pass a signal B_arith. The output Cin of the gate 13-2A is connected to the input Cin of the look-up table L2A. The output of the switch 17-2A is connected to one of the inputs of the gate 22A, and the other input of this gate is connected to the output of ME 172A. The output of the gate 22A controls the switch 15-2A, which generates the carryout signal Cyout. In adder and counter modes, the AND gate 22A passes the output of the switch 17-2A, and in normal mode it passes a logic low value which maps the input D_arith from the general routing matrix onto the carry chain.

The switch 15-2A has the input D_arith and output CY0 of the switch 15-1A as its inputs, and the input D_arith is selected when its control input is at a logic low value. Thus, the output of the switch 152A generates the signal CYout which is the carry output of the PLB. For two-bit arithmetic operation, the inputs D_arith and B_arith are taken as augend for addition (or minuend for subtraction and where D_arith is MSB) and C_arith and A_arith are taken as addend or subtrahend (where C_arith is MSB). The sum outputs (where the output acts as MSB) are passed directly as outputs of the PLB, and they can be registered in the normal mode of operation.

While performing addition, the output of the OR gate 21A is tied to a logic low value. In subtraction mode, this output is tied to a logic high, and in addition and subtraction mode the input add_sub signal is passed through the OR gate 21A (the other input of which is provided by ME 175A) which controls the additions and subtraction functions. Whenever one full addition is required, MEs 12-9A through 12-16A can be configured to pass CY0 to the output Cyout/OUT1 of the look-up table L2A.

In a counter mode of operation of the PLB, the configuration is essentially the same as that explained in preceding paragraph but with some minor changes. The switch 11-1A passes the output Q0 of the flip-flop 19-1A to its output, thus connecting Q0 to the input A of the look-up table L2A. Similarly, the switches 11-2A and 11-3A pass the output Q1 of the flip-flop 19-2A to its output to connect Q1 to the input Ci of the look-up table L2A. The gate 13-1A can pass either input B or can pull its output high. So, if it is the first stage of the counter then it is pulled high, otherwise it passes the input B to its output. The gate 13-2A passes the carry of the previous stage to its output or pulls down its output to a logic low value. If it is the first stage of the counter then it passes a logic low value to its output, otherwise it passes the previous carry. The input add_sub can be used as an up/down control just in same way it is used for addition/subtraction. For performing subtraction, the OR gate 21A is configured to pull its output to a logic high value.

In a skip counting mode of operation, the configuration is essentially the same as that in the counter mode with a few minor changes. In this mode the difference of the value of a next state and a current state is provided as inputs to the PLB at inputs B_arith and D_arith. In this case, the gate 13-1A always passes input B_arith to its output. This architecture is very useful for implementing normal functions (4 I/P functions) and arithmetic functions with less resources. Since more than one switched is controlled by a single ME (e.g., ME 172 controls six switches), so by providing independent MEs to different switches, a more flexible architecture is provided.

Referring now to FIG. 4, an alternate embodiment of the look-up table of FIG. 2 is illustratively shown which includes an XOR gate for upper and lower part selection. The output of the sixteen memory cells 12 are connected to one of the inputs of respective AND gates 14-1B through 14-16B.

The input A is applied to one of the inputs of the AND gates 14-2B, 14-4B, 14-6B, and 14-8B, and an inverted input A is applied to one of the inputs of AND gates 14-1B, 14-3B, 14-5B, and 14-7B. The input C is applied to one of the inputs of the AND gates 14-10B, 14- 12B, 14-14B, and 14-16B, and the inversion thereof is applied to one of the inputs of the AND gates 14-9B, 14-11B, 14-13B, and 14-15B. Thus, the inputs A and C enable half of the AND gates 14B and disable the other half. The OR gates 16B pass the output of enabled AND gates 14B to the next level of AND gates 18B.

The input B is applied to one of the inputs of the AND gates 18-2B and 18-4B, and the inversion thereof is applied to one of the inputs of the AND gates 18-1B and 18-3B. The input D is applied to one of the inputs of the AND gates 18-6B and 18-8B, and the inversion thereof is applied to one of the inputs of the AND gates 18-5B and 18-7B. The inputs B and C enable half of the AND gates 18B and disable the other half of the AND gates. Thus, the inputs B and D select four of eight memory cells' 12 outputs selected by inputs A and C. The OR gates 20 pass the outputs of enabled AND gates 18B to the next level of AND gates 22B and to the outputs C_L, C_Li, C_U, C_Ui of the look-up table L2B.

The output of the switch 26-1B, which selects one of the inputs Cin or C and is controlled by output of ME 172B, is applied to one of the inputs of the AND gate 22-2B, and its inversion is applied to one of the inputs of the AND gate 22-1B. The output of the switch 26-2, which selects one of the inputs CY0 or B and is controlled by output of ME 172B, is applied to one of the inputs of the AND gate 22-4B, and the inversion thereof is applied to one of the inputs of the AND gate 22-3B. Two of four inputs (either Cin and CY0 or C and B) enable half of the AND gates 22B and disable the other half of those AND gates. Thus, two of the four memory cells' 12 outputs selected by inputs B and C are selected by the aforementioned two of four inputs. The OR gates 24B pass the outputs of the enabled AND gates 22B to the next level of AND gates 28B. The output of the OR gate 24B is passed to the next level AND gates 28B, and the output of the OR gate 24-2B is also passed to the output OUT1 of look-up table L2B.

The output of the AND gate 32B, whose inputs are the the XOR of the inputs A and D (i.e., by the XOR 30B) and the output of ME 172B, is applied to one of the inputs of the AND gate 28-2B, and the inversion thereof is applied to one of the inputs of the AND gate 28-1B. The above noted output enables half of the AND gates 28B and disables the other half of the AND gates. Thus, one of the two memory cells' 12 outputs passed by the previous level OR gates 24B is selected. The OR gate 34B passes the outputs of the enabled AND gates 28B to the final output OUT0 of the look-up table L2B.

Figure 5:
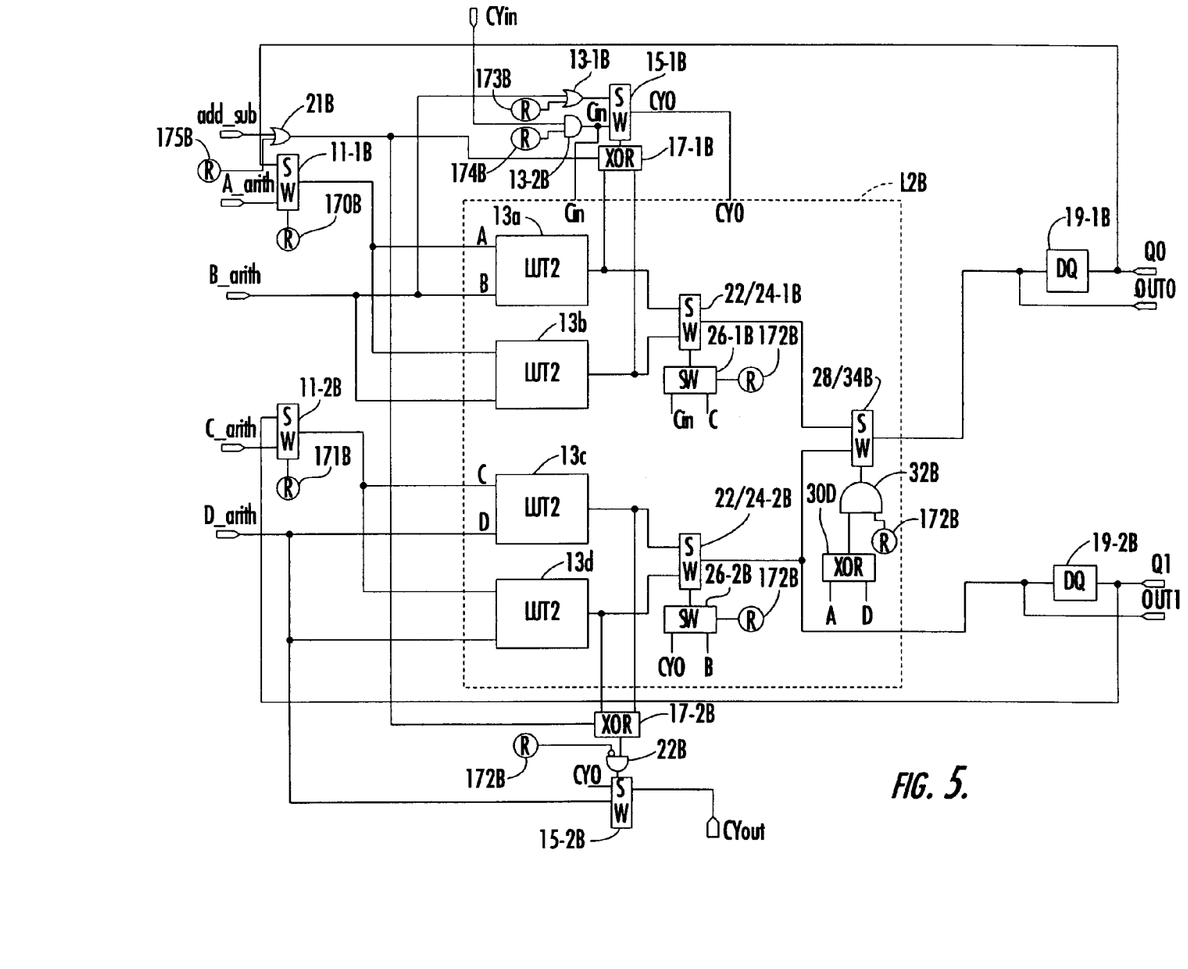
FIG. 5 is a schematic block diagram of a complete arithmetic and counting unit using the modified look-up table of FIG. 4.

Turning now to FIG. 5, an example of how the modified look-up table L2B illustrated in FIG. 4 can be used with other circuitry in accordance with the present invention to provide a highly flexible and logic block for use in programmable logic arrays is shown. The PLB shown in FIG. 5 has four regular data inputs A_arith–D_arith (these inputs are configurably connected to inputs A–D, respectively, of the look-up table), carry in input CYin (which is the carry out output of another PLB), and an input add_sub which can dynamically set the addition or subtraction mode during binary arithmetic operation, or up or down counting mode during binary counter operation.

The PLB illustrated in FIG. 5 has five outputs, i.e., four regular data outputs from output drivers and a carry out output. The carry out output connects to the carry in input of another PLB, typically an adjacent PLB, and is used for carrying out addition, subtraction, addition and subtraction, or counting (up, down, up and down, skip). Again, skip counting means that counting states can be skipped by providing a value by which skipping is to occur (both up and down).

When the PLB is used to perform a normal logic operation rather than addition, subtraction, or counting, the switch 11-1B, which is controlled by the output of ME 170B, connects the input A_arith of the PLB to the input A of the look-up table L2B. Further, the switch 11-2B, which is controlled by the output of ME 171B, connects the input C_arith of the PLB to the input C of the look-up table. The switch 26-1B of the look-up table L2B passes the input C_arith of the PLB to its output, the switch 26-2B of the look-up table L2B passes the input B_arith of the PLB to its output, and the AND gate 32B of the look-up table L2B passes the XOR of the inputs A_arith and D_arith of the PLB. The outputs OUT0 and OUT1 of the look-up table L2B are applied to outputs OUT0 and OUT1, of the PLB, respectively. These outputs OUT0 and OUT1 of the look-up table L2B are also connected to the inputs of flip-flops 19-1B and 19-2B, respectively, which provide registered outputs Q0 and Q1, respectively.

In a normal mode of operation of the PLB, two functions of two inputs (these two inputs are A_arith and B_arith, and C_arith and D_arith) can also be implemented using the same look-up table L2B. In this mode all the connections remain the same as in the normal mode (explained previously) except that the switch 261B of the look-up table L2B passes the input Cin of the look-up table L2 to its output. Further, the switch 26-2B of the look-up table L2B passes the input CY0 of the look-up table L2B to its output, and the output of the AND gate 32B of the look-up table L2B is tied to logic low.

In an arithmetic mode of operation, one PLB can perform a maximum of two places of binary addition or subtraction, or addition and subtraction. In this mode all the connections are the same as that in the mode explained above. The outputs C_L, C_Li (which in this mode is inversion of C_L) and C_U, C_Ui (i.e., the inversion of C_U) of the look-up table L2B are connected to the inputs of switches 17-1B and 17-2B, respectively, which are controlled by the output of the OR gate 21B. The OR gate 21B receives an add sub input of the PLB and an output of ME 175B as its inputs. The switches 17B implement XOR functionality in this mode where a second input thereto is the complement of the first input.

An output of the switch 17-1B is connected to a control input of the switch 15-1B, whose inputs are outputs of gates 13-1B and 13-2B, which is used to generate carry out the signal CY0. The output of the gate 13-1B is passed to the output of the switch 15-1B when its control input is at logic low. The gate 13-1B receives an input B_arith and the output of ME 173B as its inputs. The gate 13-2B has the input CYin and the output of ME 174B as its inputs.

In this mode, the gate 13-2B can be configured to pass either the carry from previous stage or a logic low signal, and the gate 13-1B is configured to pass the B_arith signal. The output Cin of the gate 13-2B is connected to the input Cin of the look-up table L2B. The output of the switch 17-2B is connected to one of the inputs of the gate 22B, and the other input of this gate is connected to the output of ME 172B. The output of the gate 22B controls the switch 15-2B, which generates the carryout signal Cyout.

In adder and counter modes, the AND gate 22B passes the output of the switch 17-2B, and in a normal mode it passes a logic low value which maps the input D_arith from the general routing matrix onto the carry chain. The switch 15-2B has as its inputs the input D_arith and the output CY0 of the switch 15-1B, and the input D_arith is selected when its control input is at a logic low value. Thus, the output of the switch 15-2B generates the signal Cyout, which is the carry output of PLB.

For two-bit arithmetic operation, the intputs D_arith and B_arith are taken as augend for addition (or minuend for subtraction, and where D_arith is the MSB) and C_arith and A_arith are taken as addend or subtrahend (where C_arith is the MSB). The sum outputs (where the output acts as the MSB) are passed directly as outputs of the PLB, and they can be registered as explained in the normal mode of operation. While performing addition, the output of the OR gate 21B is tied to a logic low value.

In the subtraction mode, this output is tied to a logic high, and in addition and subtraction mode the input signal add_sub is passed through the OR gate 21B, whose other input is ME 175B, which controls the additions and subtraction functions. Whenever one full addition is required, MEs 12-9B through 12-16B can be configured to pass Cyout/CY0 to the output OUT1 of the look-up table L2B. The arithmetic operation includes addition, subtraction and counting.

In a counter mode of operation, the PLB configuration is the same as that explained above with some minor changes. The switch 11-1B passes the output Q0 of the flip-flop 19-1B to its output, thus connecting the output Q0 to the input A of the look-up table L2B. Similarly, the switch 11-2B passes the output Q1 of the flip-flop 19-2B to its output to connect Q1 to the input C of the look-up table L2B. The gate 13-1B can pass either the input B or can pull its output high. So, if it is the first stage of the counter then it is pulled high, otherwise it passes B to its output.

The gate 13-2B passes the carry of the previous stage to its output or pulls down its output to a logic low value. If it is the first stage of the counter then it passes a logic low value to its output, otherwise it passes the previous carry. The input add_sub can be used as an up/down control in the same way it is used for addition/subtraction. For performing subtraction, the OR gate 21B is configured to pull its output to logic high value.

In a skip counting mode of operation, the configuration is the same as that in the counter mode with some minor changes. In this mode, the difference of the value of the next state and the current state is provided as inputs B_arith and D_arith. In this case, the gate 13-1B always passes the input B_arith to its output. This architecture is particularly useful for implementing normal functions (4 I/P functions) and arithmatic functions with less resources and good speed.

Since more than one switch is controlled by a single ME (e.g., ME 172 controls four switches), by providing independent MEs to different switches a very flexible architecture is provided. For example, if all of the four switches are controlled by an independent ME, then this architecture will be able to implement two functions of three inputs with two common inputs (B and C)

That which is claimed is:

1. A programmable look-up table apparatus comprising:
a plurality of programmable data storage cells each providing a cell output signal indicative of data stored therein;
means for selecting one of said cell output signals as an output signal and comprising
a plurality of successive selection means each being responsive to a respective one of a plurality of input signals,
a first selection means selecting one of two mutually exclusive and collectively exhaustive subsets of the cell output signals, and each successive selection means selecting one of two mutually exclusive and collectively exhaustive subsets of cell output signals selected by a preceding selection means until a last selection means produces the output signal;
the look-up table apparatus being divided into equal first and second halves, excluding said last selection means, where each half comprises half of the remaining selection means, half of said programmable data storage cells, and half of the input signals;
first means for selecting a selection input for a final selection means in each of said first and second halves to be a first input signal from the second half during a normal mode and a carry out signal from a previous bit operation during a two-bit arithmetic mode, said last selection means receiving a second input signal from the second half; and
second means for connecting an output from said final selection means of said first half as a least significant output bit of the two-bit arithmetic operation and for connecting an output of said final stage of said second half as a most significant output bit of the two-bit arithmetic operation during the arithmetic mode, said second means also allowing normal selection operation using one of the input signals during the normal mode.

2. The programmable look-up table apparatus of claim 1 further comprising means for selectively applying at least one input signal of said second half and said first half as the first input signal to said second half.

3. The programmable look-up table apparatus of claim 1 further comprising additional logic means connected to each half for generating the carry out signal for the corresponding bit operation and a sum output.

4. The programmable look-up table apparatus of claim 3 wherein said additional logic means comprises an exclusive OR gate receiving the output from the final selection means of a respective half as a selection signal for selecting at least one of a carry in signal and the second input signal to generate the carry out signal.

5. The programmable look-up table apparatus of claim 1 wherein the look-up table apparatus further has a counting mode of operation; and further comprising a respective storage element connected to the output of each half for storing the result of a previous arithmetic operation for use as an input to each respective half for performing counting during the counting mode.

6. The programmable look-up table apparatus of claim 1 wherein said first means in each half comprises a multiplexer.

7. The programmable look-up table apparatus of claim 1 wherein said second means comprises a logic gate.

8. The programmable look-up table apparatus of claim 1 wherein said logic gate comprises an AND gate.

9. The programmable look-up table apparatus of claim 1 wherein said first means for each half receives the first input signal from the other half during the normal mode and the carry out signal from the least significant bit operation during the arithmetic mode; and wherein said last selection means comprises a logic gate receiving as inputs a last selection signal from each half to enable the look-up table to function as at least one of a single look-up table of n inputs or two independent look-up tables of n-1 inputs, each in the normal mode, while retaining the functionality of the arithmetic mode of operation.

10. A programmable look-up table apparatus comprising:
a plurality of programmable data storage cells each providing a cell output signal indicative of data stored therein;
a plurality of successive selection stages each being responsive to a respective one of a plurality of input signals, a first selection stage selecting one of two mutually exclusive subsets of the cell output signals, and each successive selection stage selecting one of two mutually exclusive subsets of cell output signals selected by a preceding selection stage until a last selection stage produces an output signal;
the look-up table apparatus being divided into equal first and second halves, excluding said last selection stage, where each half comprises half of the remaining selection stages, half of said programmable data storage cells, and half of the input signals;
first circuitry for selecting a selection input for a final selection stage in each of said first and second halves to be a first input signal from the second half during a normal mode and a carry out signal from a previous bit operation during a two-bit arithmetic mode, said last selection stage receiving a second input signal from the second half; and
second circuitry for connecting an output from said final selection stage of said first half as a least significant output bit of the two-bit arithmetic operation and for connecting an output of said final stage of said second half as a most significant output bit of the two-bit arithmetic operation during the arithmetic mode.

11. The programmable look-up table apparatus of claim 10 wherein said second circuitry also allows normal selection operation using one of the input signals during the normal mode.

12. The programmable look-up table apparatus of claim 10 further comprising a circuit for selectively applying at least one input signal of said second half and said first half as the first input signal to said second half.

13. The programmable look-up table apparatus of claim 10 further comprising at least one logic device connected to each half for generating the carry out signal for the corresponding bit operation and a sum output.

14. The programmable look-up table apparatus of claim 13 wherein said at least one logic device comprises an exclusive OR gate receiving the output from the final selection stage of a respective half as a selection signal for selecting at least one of a carry in signal and the second input signal to generate the carry out signal.

15. The programmable look-up table apparatus of claim 10 wherein the look-up table apparatus further has a counting mode of operation; and further comprising a respective storage element connected to the output of each half for storing the result of a previous arithmetic operation for use as an input to each respective half for performing counting during the counting mode.

16. The programmable look-up table apparatus of claim 10 wherein said first circuitry in each half comprises a multiplexer.

17. The programmable look-up table apparatus of claim 10 wherein said second circuitry comprises a logic gate.

18. The programmable look-up table apparatus of claim 10 wherein said logic gate comprises an AND gate.

19. A programmable logic device comprising:
a plurality of programmable look-up table apparatuses each comprising
a plurality of programmable data storage cells each providing a cell output signal indicative of data stored therein,
a plurality of successive selection stages each being responsive to a respective one of a plurality of input signals, a first selection stage selecting one of two mutually exclusive subsets of the cell output signals, and each successive selection stage selecting one of two mutually exclusive subsets of cell output signals selected by a preceding selection stage until a last selection stage produces an output signal,
each look-up table apparatus being divided into equal first and second halves, excluding said last selection stage, where each half comprises half of the remaining selection stages, half of said programmable data storage cells, and half of the input signals,
first circuitry for selecting a selection input for a final selection stage in each of said first and second halves to be a first input signal from the second half during a normal mode and a carry out signal from a previous bit operation during a two-bit arithmetic mode, said last selection stage receiving a second input signal from the second half, and
second circuitry for connecting an output from said final selection stage of said first half as a least significant output bit of the two-bit arithmetic operation and for connecting an output of said final stage of said second half as a most significant output bit of the two-bit arithmetic operation during the arithmetic mode.

20. The programmable logic device of claim 19 wherein said second circuitry of each programmable look-up table apparatus also allows normal selection operation using one of the input signals during the normal mode.

21. The programmable logic device of claim 19 wherein each programmable look-up table apparatus further comprises a circuit for selectively applying at least one input signal of said second half and said first half as the first input signal to said second half.

22. The programmable logic device of claim 19 wherein each programmable look-up table apparatus further comprises at least one logic device connected to each half for generating the carry out signal for the corresponding bit operation and a sum output.

23. The programmable logic device of claim 22 wherein said at least one logic device comprises an exclusive OR gate receiving the output from the final selection stage of a respective half as a selection signal for selecting at least one of a carry in signal and the second input signal to generate the carry out signal.

24. The programmable logic device of claim 19 wherein the look-up table apparatus further has a counting mode of operation; and further comprising a respective storage element connected to the output of each half for storing the result of a previous arithmetic operation for use as an input to each respective half for performing counting during the counting mode.

25. A method for configuring a programmable look-up table apparatus comprising a plurality of programmable data storage cells each providing a cell output signal indicative of data stored therein, a plurality of successive selection stages each being responsive to a respective one of a plurality of input signals, a first selection stage selecting one of two mutually exclusive subsets of the cell output signals, and each successive selection stage selecting one of two mutually exclusive subsets of cell output signals selected by a preceding selection stage until a last selection stage produces an output signal, the method comprising:

dividing the look-up table apparatus into equal first and second halves, excluding the last selection stage, where each half comprises half of the remaining selection stages, half of the programmable data storage cells, and half of the input signals;

selecting a selection input for a final selection stage in each of the first and second halves to be a first input signal from the second half during a normal mode and a carry out signal from a previous bit operation during a two-bit arithmetic mode, the last selection stage receiving a second input signal from the second half; and connecting an output from the final selection stage of the first half as a least significant output bit of the two-bit arithmetic operation and connecting an output of the final stage of the second half as a most significant output bit of the two-bit arithmetic operation during the arithmetic mode.

26. The method of claim 25 further comprising selectively applying at least one input signal of the second half and the first half as the first input signal to the second half.

27. The method of claim 25 further comprising generating the carry out signal for the corresponding bit operation and a sum output using at least one logic device.

28. The method of claim 25 wherein the look-up table apparatus further has a counting mode of operation; and further comprising storing the result of a previous arithmetic operation in a respective storage element connected to the output of each half for use as an input to each respective half for performing counting during the counting mode.

* * * * *